United States Patent [19]

Szczebak, Jr.

[11] Patent Number: 4,920,496
[45] Date of Patent: Apr. 24, 1990

[54] APPARATUS AND METHOD FOR CALCULATING SIGNAL LEVEL IN DECIBELS

[75] Inventor: Ed Szczebak, Jr., Plano

[73] Assignee: Reliance Comm/Tec Corporation, Chicago, Ill.

[21] Appl. No.: 176,766

[22] Filed: Apr. 1, 1988

[51] Int. Cl.$^5$ .................... G01R 29/26; G06F 15/332
[52] U.S. Cl. .................... 364/481; 364/486; 455/67; 375/10
[58] Field of Search ............... 364/480–484, 364/486, 715.01, 736, 750.5, 753, 514; 324/58 A, 77 A; 375/10; 455/67, 226

[56] References Cited

U.S. PATENT DOCUMENTS 4,503,544  3/1985  Musin et al. .................... 375/10
4,608,647  8/1986  White et al. .................... 364/481
4,752,731  6/1988  Toda .................... 364/483
4,806,853  2/1989  Fleischer et al. .................... 455/67

Primary Examiner—Parshotam S. Lall
Assistant Examiner—Christopher L. Makay
Attorney, Agent, or Firm—Michael M. Rickin

[57] ABSTRACT

An apparatus and method for calculating signal level in decibels of a digitally encoded signal. A memory has stored in it a first lookup table with values representing the square of signal amplitude. The memory also has stored in it a second lookup table with values representing signal level in decibels. The signal is sampled for a predetermined number of times and each sample is used to address the first lookup table. The read out square of signal amplitude values are summed and the sum is used to address the second table.

14 Claims, 2 Drawing Sheets

APPARATUS AND METHOD FOR CALCULATING SIGNAL LEVEL IN DECIBELS

BACKGROUND OF THE INVENTION

1. Field of the Invention

This invention relates to the determination and display of signal level in decibels and more particularly to an apparatus and method for performing the same.

2. Description of the Prior Art

In many applications it is desirable to determine the level of a signal and display the same. For example, in testing a digital transmission line which carries a digital bit stream in a standard format consisting of 24 channels, a receiving test unit is connected to the line. The receiving unit selects one of the 24 channels and samples the PCM signal in that channel to determine among other things its amplitude level in decibels. That level is usually displayed along with other information about the signal such as its frequency and bit error rate. If a known PCM signal has been injected into that channel the information displayed by the receiving testing unit will then give an indication of the quality of signal transmission on that line.

As is well known in the art the signal level in decibels can be determined by performing the following steps:

(a) converting the compandored eight (8) bits in the PCM signal to a linear signal;

(b) calculating the square of the amplitude level of that signal;

(c) adding the squared amplitude level to the squared amplitude level for that signal that was calculated in the previous frame in accordance with steps a and b;

(d) repeating steps a, b, and c every 125 microseconds (the time for one frame) for a predetermined period of time, e.g. one second, so that a large number of samples of signal amplitude level are obtained;

(e) calculating the level at the end of that predetermined interval of time according to the formula $$\text{level} = \sqrt{\frac{S_1^2 + S_2^2 + \cdots + S_N^2}{N}}$$

where $S_1$ to $S_N$ are the samples of signal amplitude level and N is the number of samples;

(f) calculating the level in decibels according to the formula $$db = 20 \log\left(\frac{\text{level}}{1 \text{ mw}}\right)$$

where 1 mw is the reference level.

A processing unit such as a digital signal processor can and has been used to perform the steps described above. The level in decibels can then be displayed in any one of a number of known ways.

Alternatively and also as is well known in the art the level in decibels can be determined by the combination of a codec, RMS converter and A/D converter. The calculated level may then be displayed in decibels on a meter. The codec, RMS converter and A/D converter each introduce a conversion error and therefore the decibel level shown on the meter may not be the true level.

Over the past few years there has been increasing use of hand held battery powered equipment in the telecommunications industry to test digital transmission lines. Two examples of such hand held equipment are the T-TALKER (transmitting) and t-TAKER (receiving) units sold by the assignee of the present invention. Both of these units are powered by rechargeable batteries and weigh in the order of 19 ounces (540 grams). Such units are typically carried by a craftsperson for use in the field. In using such units, it may be desirable for the craftsperson to know the level in decibels of the signals being received at the receiving unit. Therefore it is necessary for that level to be calculated and displayed. It is also desirable that such a calculation and display be part of the hand held receiving unit without substantially changing the size of that unit.

As described above the level can be calculated by a digital signal processor. Such a processor does, however, use a number of rather expensive chip types. It also requires substantially more power for operation then is available in the hand held units described above. The batteries in the hand held units typically allow for about two to four hours of usage before they must be recharged. The level can also be calculated by the combination of converters described above. While such a combination and display can be packaged in its own portable unit, this means that a craftsperson must then use one unit for receiving signals and another unit for calculating and displaying levels. Of course, the receiving unit and the calculating and displaying unit could be put in a single package but the size of that single unit would be substantially larger then the size of the hand held receiving unit.

It is also desireable to not only calculate and display the amplitude level in decibels but also the frequency of the signal. The apparatus of the present invention is also capable of performing the calculation of signal frequency and displaying the same. A hand held receiving unit which incorporates the present invention can then calculate and display both amplitude level in decibels and signal frequency.

SUMMARY OF THE INVENTION

An apparatus for calculating amplitude level in decibels of a digitally encoded signal. The apparatus includes a data storage means which has stored in a first plurality of locations an associated one of a first plurality of values which represent signal amplitude squared. The data storage means also has stored in a second plurality of locations the associated one of a second plurality of values representing amplitude level in decibels.

The apparatus also includes means for periodically sampling the digitally encoded signal a predetermined number of times. That one of the first locations associated with each of the samples is addressed and the associated first value stored therein is read out. The apparatus further includes means which responds to each of the read out first values to determine for the predetermined number of times a sum of all of the values. Also included are means which respond to that sum for addressing the associated one of the second locations so that the second value stored therein is read out.

A method for calculating amplitude level in decibels of a digitally encoded signal. The method includes the steps of:

(a) a periodically sampling the digitally encoded signal a predetermined number of times;

(b) addressing the associated first location to read the amplitude squared value stored therein;

(c) determining for the predetermined number of times a sum of all of the read out first values; and (d) addressing the second location associated with that sum to read the amplitude level in decibels value stored therein.

DESCRIPTION OF THE PREFERRED EMBODIMENT

Figure 1:
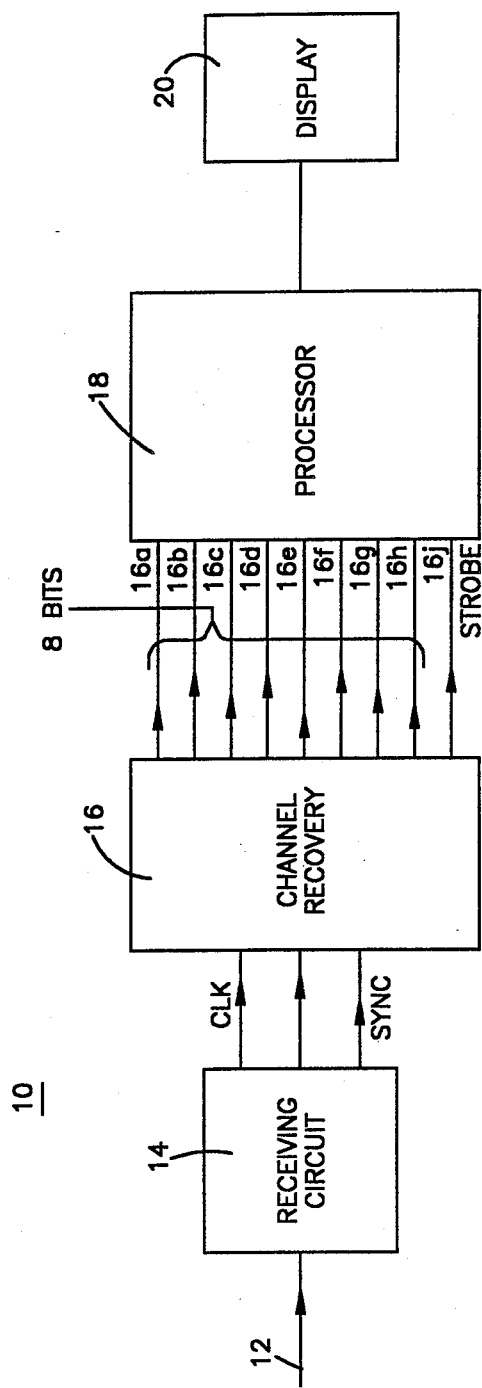
FIG. 1 is a block diagram of the apparatus of the present invention.

Referring now to FIG. 1 there is shown the apparatus 10 of the present invention. The apparatus 10 is connected to a digital transmission line 12 which carries PCM signals in the form of frames. Each frame includes the PCM signals for 24 channels and has a duration of 125 microseconds. Each channel is made up of eight (8) bits and has a duration of about 5.18 microseconds. Each frame also includes a single bit known as a synchronizing bit which has a duration of about 0.648 microseconds.

Apparatus 10 includes receiving circuit 14 which breaks the 24 channel signal on transmission line 12 into the individual channels. Circuit 14 determines the occurrence of the start of each frame by recognizing the synchronizing bit and provides a pulse indicative thereof. That pulse is known as the SYNC signal. Circuit 14 also counts the occurrence of each channel in the frame and provides a clock (CLK) signal indicative thereof. Circuit 14 may be embodied in the form of an integrated circuit chip such as the 8060 type chip available from Rockwell International.

Apparatus 10 also includes channel recovery circuit 16 which recovers from the 24 channels in the frame the one channel whose amplitude level is to be determined. Circuit 16 is connected to circuit 14 to receive therefrom the 24 channels, the SYNC signal and the CLK signal. Circuit 16 also receives the input from a channel selector (not shown), e.g. a thumbwheel switch, which is used by the craftsperson to select the one of the 24 channels in the frame whose amplitude level is to be determined in decibels by apparatus 10.

Circuit 16 includes a counter for counting the CLK signals, i.e. circuit 16 counts the channels in the frame. Circuit 16 then compares the selected channel with the channel count for the frame. When the two are equal, circuit 16 allows the eight bits in the selected channel to appear in parallel at the associated one of the eight outputs 16a to 16h. It also provides at output 16j a STROBE signal which is a pulse occurring once per frame at the timeslot associated with the selected channel. Circuit 16 uses the SYNC signal to reset the channel counter.

Figure 2:
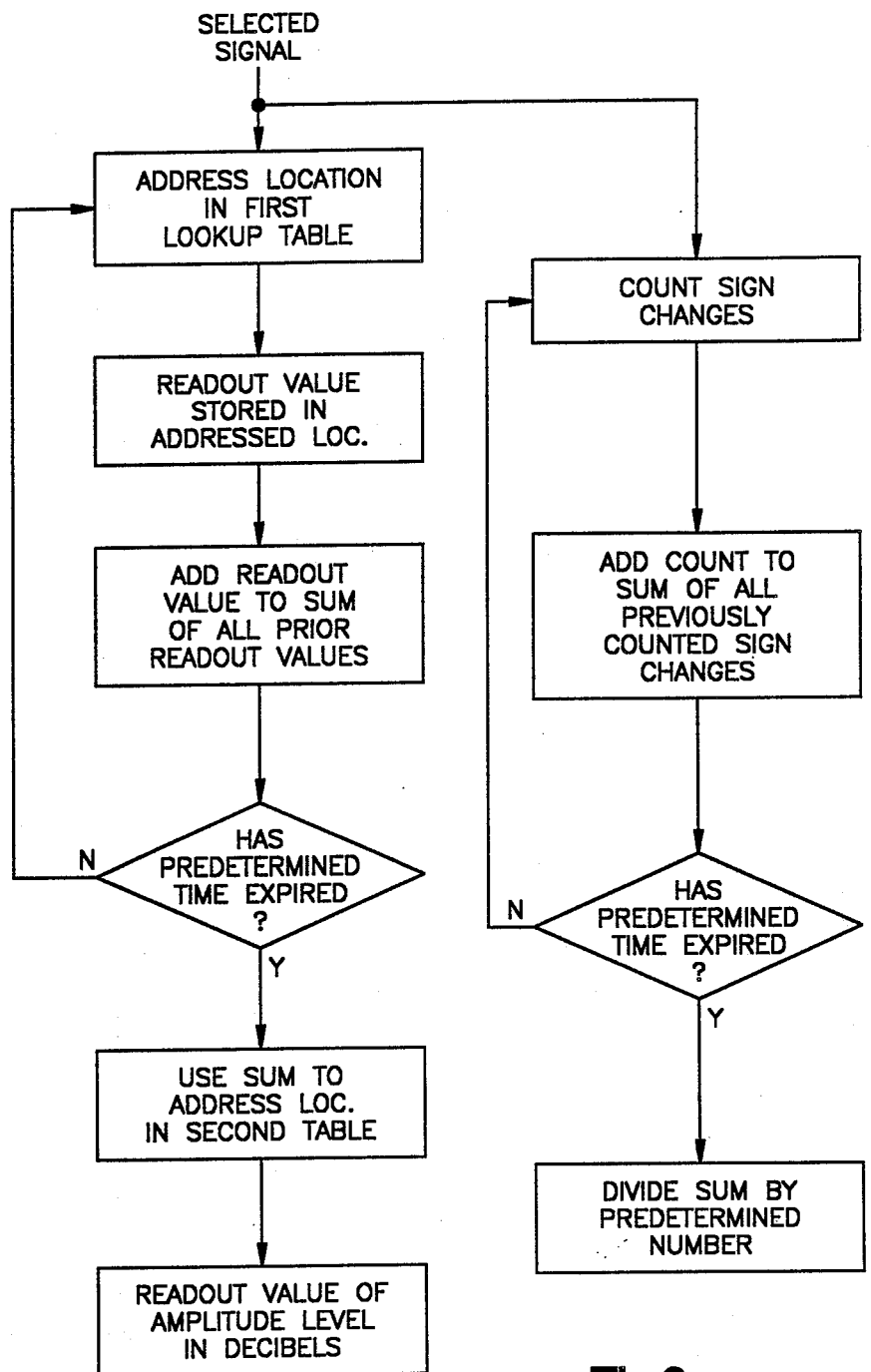
FIG. 2 is a simplified flowchart for the method of the present invention.

Apparatus 10 further includes processor 18 which is connected to outputs 16a to 16h and 16j of circuit 16. Processor 18 is programmed to calculate the amplitude level in decibels of the selected channel. There is shown in FIG. 2 a simplified flow chart of the method by which processor 18 makes that calculation.

In order for apparatus 10 to determine the amplitude level in decibels of the selected channel it is first necessary for processor 18 to calculate the square of the amplitude represented by the selected eight bits. The eight bits may have any one of 256 amplitudes in the range from 0 to 255. Therefore the range and values of the square of the amplitudes is known.

Processor 18 includes a lookup table in which are stored the squares of all of the possible amplitudes represented by the selected eight bits. Processor 18 uses the selected eight bits and the STROBE signal to address an associated one of the locations in that "amplitude squared" lookup table. The value in that location is read out and is added to the sum of all of the values read out in the previous frames (if any) for that channel. Processor 18 is programmed to repeat for a predetermined number of frames the process of addressing the amplitude squared lookup table and adding the value readout of the addressed location to the sum of all of the previously readout values for the selected channel. In one embodiment of apparatus 10 the predetermined number of frames was 8000 and processor 18 was embodied using a type 63701 processor available from Hitachi.

At the end of the predetermined number of frames, processor 18 has calculated the sum of the squares. The signal level in decibels can then be calculated from that sum by performing steps e and f of the well known prior art method previously described. I have found, however, that it is not necessary for apparatus 10 to perform those steps in order to determine the level in decibels.

It is only necessary to include in processor 18 another lookup table in which are stored an array of entries, each of which is representative of a decibel reading. The number of entries in the table depends on the total range of decibel readings to be represented by the table and the desired difference in represented decibel readings, i.e. step between each entry. The software scans the table unitl it finds that entry in the table which is just less than the sum of the squares calculated at the end of the predetermined number of frames. The index of the table is related to the decibel reading and can be used to calculate the same. That calculation involves using one end of the range of second values, the index of that location in the table wherein the entry is just less than the calculated sum of the squares and the difference in represented decibel reading between each entry in the table. It should be appreciated that as the decibel lookup table is limited in size there cannot be a unique one to one correspondence between a calculated sum of the squares and a location in the table. Rather a range of sum of the squares is associated with each location.

In the embodiment of apparatus 10 wherein the predetermined number of frames was 8000, the decibel lookup table contained entries representative of a total range of decibel readings from −90.0 db to +6.0 db in steps of 0.1 db. Therefore, the table contained 961 separate sum entries and the decibel reading can easily be calculated by adding to −90 db the product of the index of that location in the table wherein the stored entry is just less than the calculated sum of the squares multiplied by 0.1. It should be appreciated that 0.1 is the "decibel" value that each location in the table differs from any adjacent location. In other words, apparatus 10 was able to determine the signal amplitude in decibels with an error of no more than 0.1 db.

Finally, apparatus 10 includes a display 20 which is connected to processor 18 so that the value readout of the addressed location in the decibel lookup table can be displayed. In one such embodiment of apparatus 10, display 20 was of the liquid crystal type.

It should be appreciated that display 20 can also be used to display information in addition to amplitude level in decibels. For example, the frequency of the signal and bit error rate may also be displayed. Apparatus 10 and in particular processor 18 can also be used to calculate the frequency of the signal. As described above the eight bits of the selected signal appear at outputs 16a to 16h. The eighth bit of that signal represents the polarity of the signal. That bit, also known as the sign bit, changes its sign twice in each cycle, i.e. for each sample. Processor 18 may then be programmed to count the number of sign changes in the eighth bit over a predetermined time interval. If that time interval is chosen to be one second then in that interval the total number of polarity changes is twice the frequency of the signal. The total number of changes can then be divided by two to determine the frequency. A simplified flow chart for the calculation of frequency is also shown in FIG. 2.

Apparatus 10 may be part of a receiving unit (not shown in FIG. 1). That receiving unit may be of the hand held type previously described. The channel selector is typically mounted on the unit. Apparatus 10 embodied using the liquid crystal display is ideally suited for incorporation in such hand held type receiving units as even with the display, apparatus 10 does not substantially change the size of the hand held unit. It also does not substantially change the load presented to the rechargeable batteries in such units.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. Apparatus for calculating signal level in decibels of a digitally encoded signal, said apparatus comprising:
   (a) data storage means having stored therein in a first plurality of locations a first plurality of values representing signal amplitude squared, each of said first locations storing an associated one of said first values, said data storage means also having a second plurality of locations forming a table, each of said second plurality of locations having stored therein an associated one of a second plurality of values representing a range of amplitude level in decibels, each of said plurality of values differing from an adjacent value by a predetermined amount;
   (b) means for periodically sampling a predetermined number of times said digitally encoded signal for addressing that one of said first locations associated with each of said samples and reading out said associated one of said first plurality of values;
   (c) means responsive to each of said readout first values for determining for said predetermined number of times a sum of all of said readout first values; and
   (d) means responsive to said sum for calculating from where in said table that one of said second locations wherein said stored associated second value is just less than said sum is located, one end of said range and said predetermined differing amount, said amplitude level in decibels.

2. Tha apparatus of claim 1 further comprising means responsive so said calculated amplitude level in decibels for displaying same.

3. The apparatus of claim 1 wherein said digitally encoded signal is a pulse of code modulation having a known period.

4. The apparatus of claim 3 wherein said pulse code modulation signal has a predetermined number of bits, one of which represents the polarity of said signal and changes its sign twice for each of said samples and said apparatus further comprises means responsive to said samples for determining for said predetermined number of times a sum of all of said polarity representative bit sign changes and means responsive to said sign changes sum for dividing said sum by a further number having a value determined as two times the product of said predetermined number of times and said modulation signal known period to determine the frequency of said pulse code modulation signal.

5. The apparatus of claim 4 further comprising means responsive to said calculated amplitude level in decibels and said determined frequency for displaying the same.

6. The apparatus of claim 2 wherein said display means is a liquid crystal display.

7. The apparatus of claim 5 wherein said display means is a liquid crystal display.

8. Method for calculating during a predetermined time interval amplitude level in decibels of a digitally encoded signal wherein a data storage means has stored therein in a first plurality of locations a first plurality of values representing signal amplitude squared, each of said first locations storing an associated one of said first values, said data storage means also having a second plurality of locations forming a table, each of said second plurality of locations having stored therein in an associated one of a second plurality of values representing a range of amplitude levels in decibels, each of said second plurality of values differing from an adjacent value by a predetermined amount, said method comprising the steps of:
   (a) sampling said digitally encoded signal;
   (b) using said sample to address an associated one of said first locations to read out said associated one of said first values stored therein;
   (c) adding said readout first value to a sum of all of said first values read out during said predetermined time interval;
   (d) repeating steps a, b and c for said predetermined time interval; and
   (e) calculating from where in said table that one of said second locations wherein said associated stored sum is just less than said sum is located, one end of said range and said predetermined differing amount, said amplitude level in decibels.

9. The method of claim 8 further comprising the step of displaying said calculated amplitude level in decibels.

10. The method of claim 8 wherein said digitally encoded signal is a pulse code modulation signal.

11. The method of claim 10 wherein said pulse code modulation signal has a predetermined number of bits, one of which represents the polarity of said signal and changes its sign twice for each of said samples, said method also calculating the frequency of said signal, said method further comprising the steps of:
   (i) determining for said predetermined time interval a sum of all of said polarity representative bit sign changes; and
   (ii) dividing said sum by a further number having a value determined as two times said predetermined time interval to thereby calculate said frequency.

12. The method of claim 11 further comprising the step of displaying both said calculated signal amplitude in decibels and said calculated frequency.

13. The method of claim 9 wherein said display means is a liquid crystal display.

14. The method of claim 12 wherein said display means is a liquid crystal display.

* * * * *

UNITED STATES PATENT AND TRADEMARK OFFICE
CERTIFICATE OF CORRECTION

PATENT NO.   : 4,920,496
DATED        : April 24, 1990
INVENTOR(S)  : Szczebak, Jr.

It is certified that error appears in the above—identified patent and that said Letters Patent is hereby corrected as shown below:

Column 5, line 63, "Tha" should be "The".

Column 5, line 64, "so" should be "to".

Column 5, line 67, after "modulation", please insert --signal--.

Signed and Sealed this

Tenth Day of March, 1992

Attest:

HARRY F. MANBECK, JR.

*Attesting Officer*　　　　　*Commissioner of Patents and Trademarks*